(12) United States Patent
Mirea et al.

(10) Patent No.: US 7,561,391 B2
(45) Date of Patent: Jul. 14, 2009

(54) INPUT VOLTAGE SENSING CIRCUIT

(75) Inventors: Iulian Mirea, Singapore (SG); Muthu Subramanian, Fremont, CA (US)

(73) Assignee: International Rectifier Corporation, El Segundo, CA (US)

( * ) Notice: Subject to any disclaimer, the term of this patent is extended or adjusted under 35 U.S.C. 154(b) by 45 days.

(21) Appl. No.: 11/611,978

(22) Filed: Dec. 18, 2006

(65) Prior Publication Data

US 2007/0139083 A1   Jun. 21, 2007

Related U.S. Application Data

(60) Provisional application No. 60/751,912, filed on Dec. 20, 2005.

(51) Int. Cl.
*H02H 3/20* (2006.01)
(52) U.S. Cl. ........................... 361/56; 361/91.1
(58) Field of Classification Search ............. 361/56–58, 361/91.1, 111; 330/298
See application file for complete search history.

(56) References Cited

U.S. PATENT DOCUMENTS

| 5,304,865 | A | 4/1994 | Schoofs | 307/362 |
|---|---|---|---|---|
| 5,654,574 | A | 8/1997 | Williams et al. | 257/355 |
| 6,483,386 | B1 * | 11/2002 | Cress et al. | 330/298 |
| 6,953,980 | B2 | 10/2005 | Escoffier et al. | 257/499 |
| 7,209,333 | B2 * | 4/2007 | Lee et al. | 361/90 |
| 7,233,466 | B2 * | 6/2007 | Yamaguchi | 361/56 |
| 2003/0189441 | A1 * | 10/2003 | Nguyen et al. | 326/30 |
| 2005/0190516 | A1 | 9/2005 | Lee et al. | 361/90 |

FOREIGN PATENT DOCUMENTS

| CN | 1659705 | 8/2005 |
|---|---|---|
| DE | 695 04 451 | 3/1999 |

OTHER PUBLICATIONS

German Office Action mailed Aug. 8, 2008 in related German Application No. 10 2006 060 075.4-35 with English language translation thereof.
English translation of Chinese Office Action issued in related Chinese Application No. 200610167470.2.

* cited by examiner

*Primary Examiner*—Danny Nguyen
(74) *Attorney, Agent, or Firm*—Ostrolenk, Faber, Gerb & Soffen, LLP

(57) ABSTRACT

An input voltage sensing circuit comprising a circuit input terminal; a comparator having first and second input terminals, the first of said input terminals being coupled to a reference voltage; a switch circuit provided between the circuit input terminal and the second of the input terminals of the comparator, the switch being provided to protect the comparator from voltages exceeding a predetermined voltage at which the switch turns off; and an electrostatic discharge circuit coupled to the circuit input terminal for discharging electrostatic induced voltages exceeding a predetermined value.

12 Claims, 3 Drawing Sheets

INPUT VOLTAGE SENSING CIRCUIT

CROSS REFERENCE TO RELATED APPLICATIONS

The present application claims the benefit and priority of U.S. Provisional Application 60/751,912 filed Dec. 20, 2005 and entitled INPUT VOLTAGE SENSING CIRCUIT, the entire disclosure of which is hereby incorporated by reference.

BACKGROUND OF THE INVENTION

The present invention relates to sensing circuits and in particular, to sensing circuits for sensing a voltage having a wide dynamic voltage range from negative voltage to a positive high voltage and which is able to detect a threshold crossing accurately and rapidly.

Requirements for this type of circuit are that the input signal range is wide and must be capable of receiving the wide input signal range without damage to the circuit. For example, a signal range of minus 10 volts to 200 volts is within the area of application of the present invention. Further, the input stage must have a very small delay, the threshold detection must be very accurate and the input must be electrostatic discharge (ESD) protected.

Figure 1:
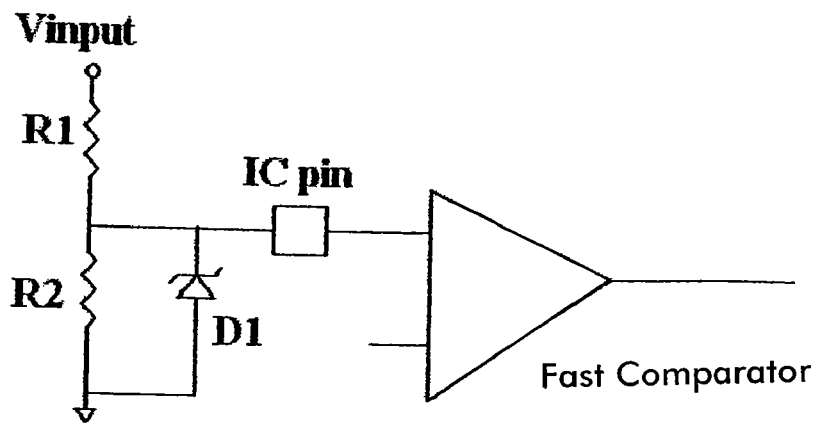

FIG. 1 shows one prior art circuit for sensing input voltages. A voltage divider comprising resistors R1 and R2 is clamped by a zener diode D1 provided at the integrated circuit input pin to a fast comparator located within an IC. A disadvantage of this circuit is that it is slow because of the external RC time constant provided by the resistor R1 and parasitic capacitance. Furthermore, it dissipates power within the voltage divider when the input is at a high voltage. Additionally, the circuit is expensive and requires space for the external components outside the IC.

Figure 2:
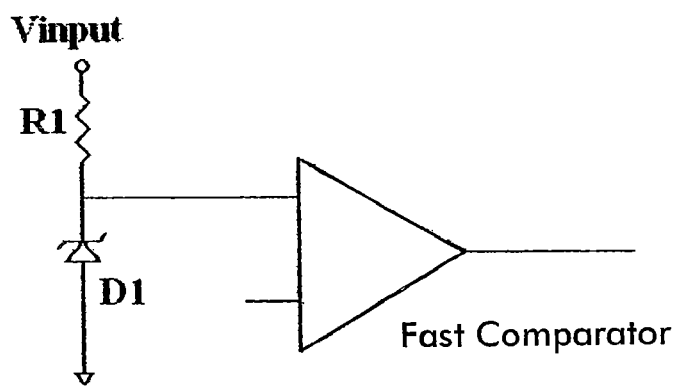

FIG. 2 shows another prior art circuit employing a resistor R1 and a zemer diode D1. An advantage of this circuit is that it can be completely integrated in the IC. Disadvantages include the RC delay is still significant due to the tradeoff between power dissipated in the resistor R1 and the RC time constant, as a high value of R1 is necessary to achieve a low power dissipation. Further, this circuit requires a high voltage resistor R1 which is often not readily available.

SUMMARY OF THE INVENTION

The present invention provides a new high voltage input structure, which allows for a fast and accurate sensing while offering ESD protection. The structure can also withstand very wide range for input voltages, for example, but not limited to, minus 10 volts to 200 volts. Another advantage is that it can be completely integrated in an IC, offering an inexpensive solution through direct sensing. Furthermore, the structure can be made using standard components available in a high voltage IC fabrication process.

According to the invention, an input voltage sensing circuit is provided comprising an input voltage sensing circuit comprising a circuit input terminal; a comparator having first and second input terminals, the first of said input terminals being coupled to a reference voltage; a switch circuit provided between the circuit input terminal and the second of the input terminals of the comparator, the switch being provided to protect the comparator from voltages exceeding a predetermined voltage at which the switch turns off; and an electrostatic discharge circuit coupled to the circuit input terminal for discharging electrostatic induced voltages exceeding a predetermined value.

Other objects, features and advantages of the present invention will be apparent from the detailed description which follows.

BRIEF DESCRIPTION OF THE DRAWING(S)

Figure 3:
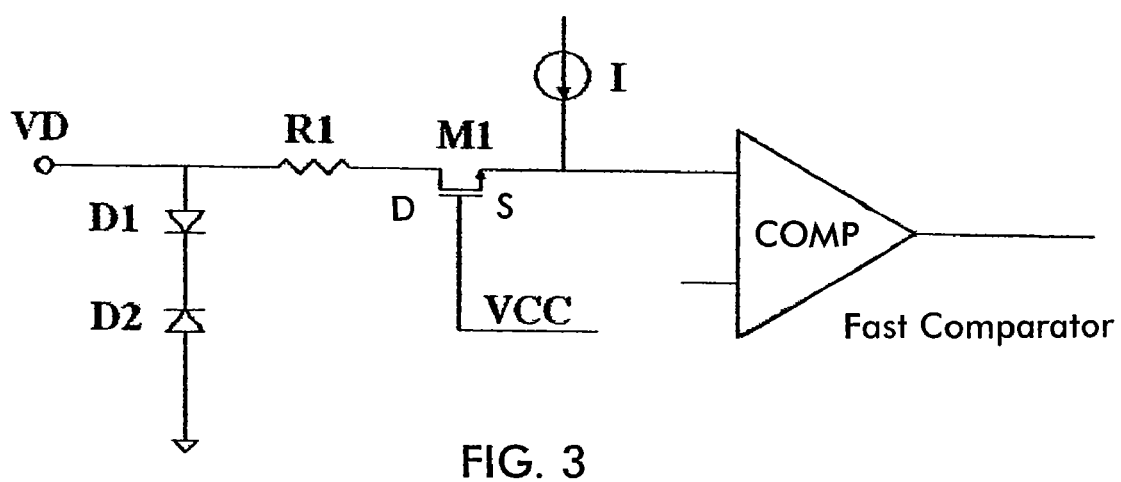
Figure 4:
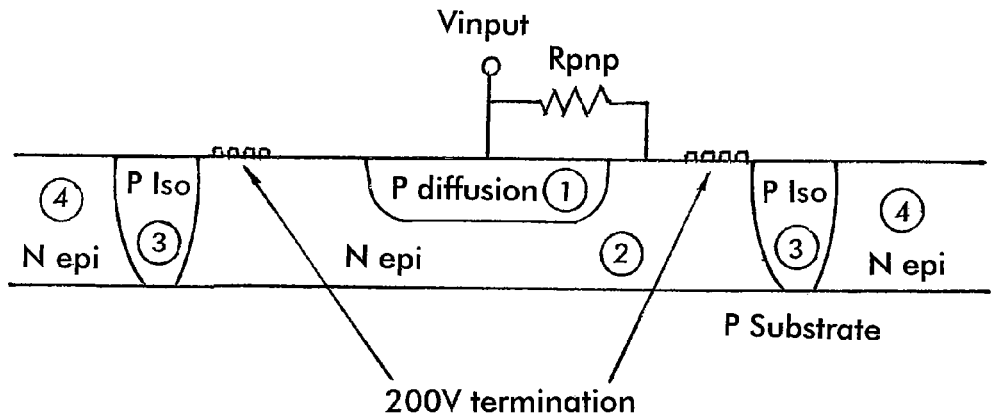
Figure 5:
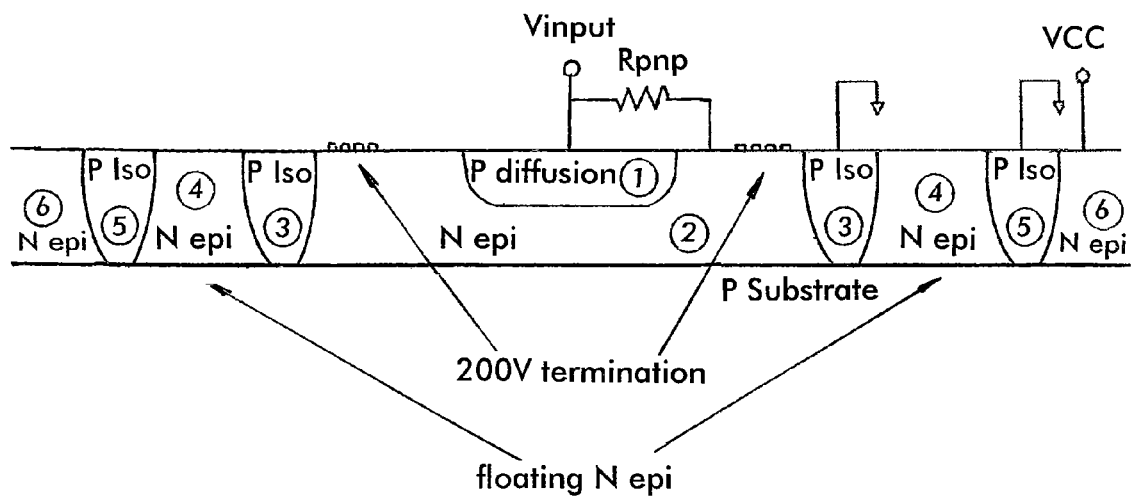
Figure 6:
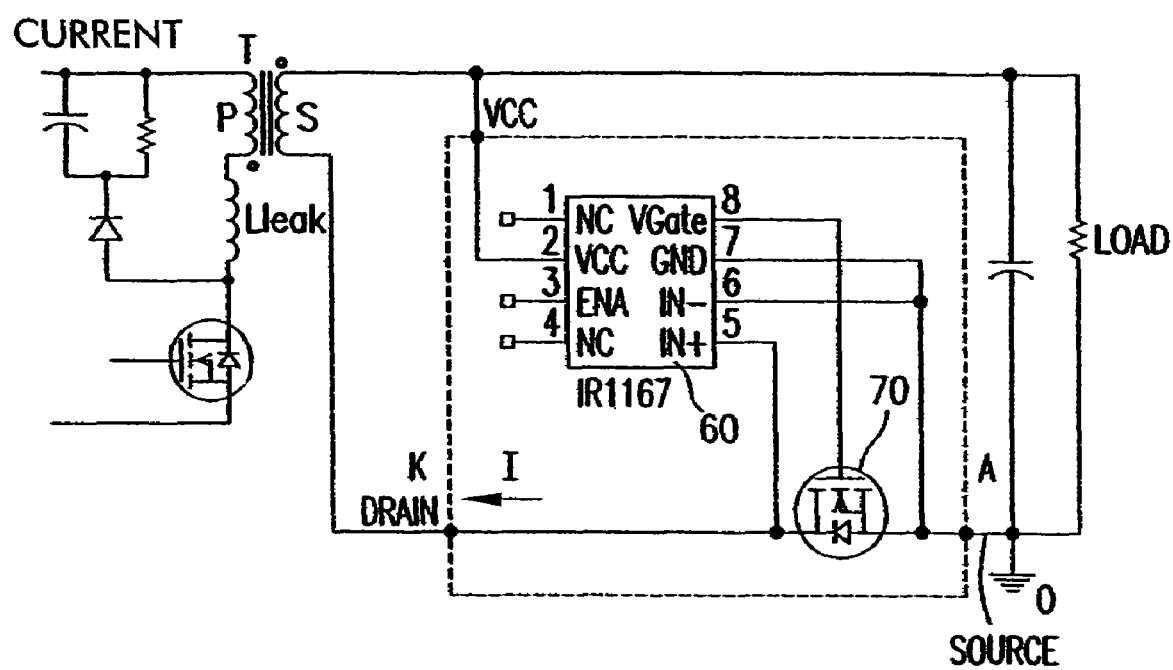

The invention will be described in greater detail in the following detailed description with reference to the drawings in which:

FIG. 1 shows a prior art circuit;
FIG. 2 shows another prior art circuit;
FIG. 3 shows a circuit according to the present invention;
FIG. 4 shows an ESD circuit;
FIG. 5 shows the structure according to the present invention incorporating an ESD structure; and
FIG. 6 shows an application of the circuitry of FIG. 3.

DETAILED DESCRIPTION OF PREFERRED EMBODIMENTS OF THE INVENTION

With reference now to the drawings, FIG. 3 shows the input voltage sensing circuit according to the invention. Transistor M1 is a high voltage MOSFET, for example an NMOS. It will protect the low voltage input of the fast comparator COMP by turning itself off when the input voltage is higher than VCC up to the drain breakdown voltage, for example, greater than 200 volts.

Reverse coupled diodes D2 and D1 form a high voltage ESD protection circuit. D2 may comprise a high voltage termination diode. It serves two purposes: to form a high voltage ESD device (e.g. 200 v) and to provide a high voltage substrate for the resistor R1. In this way, resistor R1 will only be a normal low voltage polysilicon resistor instead of a high voltage resistor and it will not effect the accuracy of the sensing.

Diode D1 may comprise a low voltage diode used to block the conduction through the ESD circuit when the input is set to a negative voltage up to minus 10 volts.

Resistor R1 also serves to protect transistor M1 from electrostatic discharge; to limit the current when the input voltage goes negative; and to provide a possibility for negative voltage sensing. By injecting the current I from a current source in the M1 source and considering VFORWARDMAX as the maximum acceptable forward bias across the body diode (not shown) of M1, for example, 50 millivolts, the minimum negative voltage that can be sensed is VFORWARDMAX×R1/RDSONM1.

The high voltage ESD circuit should be designed to avoid latch up when the input voltage goes negative.

FIG. 4 depicts a normal high voltage diode D2 between zone 2 and zone 3 in the figure. Zone 3 is circular P isolation region surrounding zone 2 (high voltage N epitaxial region). Zone 4 is the low voltage (up to 20 volt) N epi for the low voltage components.

The structure shown in FIG. 4 contains a parasitic NPN transistor in zones 2, 3 and 4 and a parasitic PNP transistor in zones 1, 2 and 3. These two parasitic devices will form a thyristor which will turn on when the input voltage goes negative. The high voltage circuit according to the invention avoids the thyristor from turning on by lowering drastically the beta gain for the NPN structure so beta NPN×beta PNP will be less than 1 and the thyristor will always be off.

The cross section of one embodiment of the high voltage ESD structure according to the invention is shown in FIG. 5. Zones 4 and 5 are also circular. Zone 4 is left floating so no current can flow through it. The collector of the parasitic NPN transistor is the zone 6. The current injected by zone 2 will not be transferred to zone 4 anymore through the transistor effect and the current transferred to zone 6 will be much smaller. Therefore, the current gain of the parasitic NPN transistor is greatly reduced. For further reduction of the NPN transistor gain another floating N epi and P isolation rings can be added.

The resistor between VINPUT (VD node in FIG. 3) and zone 2 is used to adjust the breakdown voltage VCE0 of the PNP transistor formed by zones 1, 2 and 3. A breakdown voltage too low (lowest when there is no resistor) will limit the maximum voltage on the input in normal operation and a breakdown voltage too high will weaken the ESD capability.

FIG. 6 shows one application of the input voltage sensing circuit. The circuit can be incorporated in a controller 60 (input at IN− and IN+) to sense the voltage across a synchronous rectifier 70 to determine when the current begins to flow in a direction when the synchronous rectifier device should be turned on by the controller 60.

Although the present invention has been described in relation to particular embodiments thereof, many other variations and modifications and other uses will become apparent to those skilled in the art. Therefore the present invention should be limited not by the specific disclosure herein, but only by the appended claims.

What is claimed is:

1. An input voltage sensing circuit comprising:
a circuit input terminal;
a comparator having first and second input terminals, the first of said input terminals being coupled to a reference voltage;
a switch circuit provided between the circuit input terminal and the second of the input terminals of the comparator, the switch circuit being provided to protect the comparator from voltages exceeding a predetermined voltage at which the switch circuit turns off; and
an electrostatic discharge circuit coupled to the circuit input terminal for discharging electrostatic induced voltages exceeding a predetermined value, wherein the electrostatic discharge circuit comprises first and second reverse series connected diodes, the first diode comprising a low voltage diode for blocking conduction when the input voltage exceeds a predefined negative voltage and the second diode comprising a high voltage termination diode.

2. The input voltage sensing circuit of claim 1, further comprising a resistor in series with the switch circuit.

3. The input voltage sensing circuit of claim 2, wherein the second diode provides a high voltage substrate for the resistor.

4. The input voltage sensing circuit of claim 1, wherein the electrostatic discharge circuit comprises a structure wherein the second diode comprises a PN junction, and wherein a P region forming the diode is a circular isolation surrounding a presum high voltage N epitaxial region forming the N region of the diode, a low voltage N epitaxial region being provided on an opposite side of said P region from said high voltage N epitaxial region, said structure containing a parasitic NPN transistor comprising the N epitaxial high voltage region, the P region and the low voltage N epitaxial region and further comprising a parasitic PNP transistor by a further P region connected to the circuit input terminal, the N epitaxial high voltage region and said isolation presum and wherein said parasitic NPN and PNP transistors form a thyristor, and wherein a gain of the parasitic NPN transistor is reduced so that the gain of the NPN transistor multiplied by a gain of the PNP transistor will be less than 1 thereby preventing the thyristor from turning on when the input voltage goes negative.

5. The input voltage sensing circuit of claim 4, wherein there is provided a second P isolation region surrounding the low voltage N epitaxial region and the low voltage N epitaxial region is left floating, there being provided a further N epitaxial region on an opposite side of said second P region.

6. The input voltage sensing circuit of claim 5, wherein there is provided a resistor for adjusting a collector-emitter breakdown voltage of the parasitic PNP transistor disposed between said circuit input terminal and said high voltage N epitaxial region.

7. The input voltage sensing circuit of claim 5, wherein said P regions are coupled to ground and said second N epitaxial region is coupled to a voltage source.

8. The input voltage sensing circuit of claim 5, further comprising at least one additional floating N epitaxial region and P isolation region provided to further reduce the gain of the parasitic NPN transistor.

9. An input voltage sensing circuit comprising:
a circuit input terminal;
a comparator having first and second input terminals, the first of said input terminals being coupled to a reference voltage;
a switch circuit provided between the circuit input terminal and the second of the input terminals of the comparator, the switch circuit being provided to protect the comparator from voltages exceeding a predetermined voltage at which the switch circuit turns off; and
an electrostatic discharge circuit coupled to the circuit input terminal for discharging electrostatic induced voltages exceeding a predetermined positive value and a predetermined negative value;
wherein the switch circuit comprises a transistor;
wherein the transistor comprises a MOSFET having drain and source terminals connected in series between the circuit input terminal and the second comparator input terminal and having a gate connected to a voltage level at approximately which the transistor turns off; and
further comprising a current source coupled to said second input of the comparator for providing a current to forward bias a body diode of said MOSFET to allow negative input voltage sensing.

10. The input voltage sensing circuit of claim 9, further comprising a resistor in series with the switch circuit.

11. The input voltage sensing circuit of claim 10, wherein the resistor comprises a low voltage polysilicon resistor.

12. An input voltage sensing circuit comprising:
a circuit input terminal;
a comparator having first and second input terminals, the first of said input terminals being coupled to a reference voltage;
a switch circuit provided between the circuit input terminal and the second of the input terminals of the comparator, the switch circuit being provided to protect the comparator from voltages exceeding a predetermined voltage at which the switch circuit turns off; and
an electrostatic discharge circuit coupled to the circuit input terminal for discharging electrostatic induced voltages exceeding a predetermined value, wherein the circuit is provided to sense a voltage across source-drain terminals of a MOSFET used as a synchronous rectifier to determine when to turn on the MOSFET.

* * * * *